Dec. 17, 1963 M. E. SZEKELY 3,114,867

UNIPOLAR TRANSISTORS AND ASSEMBLIES THEREFOR

Filed Sept. 21, 1960

INVENTOR.
MICHAEL E. SZEKELY
BY
W.S. Hill
AGENT

United States Patent Office 3,114,867
Patented Dec. 17, 1963

3,114,867
UNIPOLAR TRANSISTORS AND ASSEMBLIES THEREFOR

Michael E. Szekely, Belle Mead, N.J., assignor to Radio Corporation of America, a corporation of Delaware Filed Sept. 21, 1960, Ser. No. 57,440
7 Claims. (Cl. 317—235)

The present invention relates to improved unipolar transistors and, in particular, to improvements in the structure of such transistors making them better adapted for operation at higher frequencies and for mounting on printed circuits. The invention also relates to arrays of such transistors on a single semiconductor body and to the mounting of these arrays on printed circuits.

Unipolar transistors comprise, in general, a body of semiconductive materials, such as germanium or silicon, having one ohmic connection, usually called a source, and another ohmic connection, usually called a drain, to spaced areas thereof. The body, itself, is of one conductivity type, either N or P, and the source and drain are relatively biased to cause a flow of majority carriers from the source to the drain. When the body is of N-type conductivity, the majority carriers are electrons. When the body is P-type, the majority carriers are holes.

Built into the body is a region or zone of conductivity type opposite that of the major portion of the body. This region is disposed adjacent the path of flow of the majority carriers from the source to the drain and is often referred to as a gate electrode. An ohmic connection, called the gate connection, is made to this region and this connection is energized so that the PN junction between the gate region and the remainder of the body is biased in the reverse direction. Due to the reverse bias, a space charge region is generated adjacent the junction, the extent of this space charge region into the body being dependent upon and variable with the magnitude of the gate potential. The doping of the gate region is preferably higher than the doping of the main body to restrict the space charge region mostly to the main body.

Variations in the extent of the space charge region cause corresponding variations to appear in the cross sectional area of the path available for flow of majority carriers from source to drain. The gate may thus be used to control the flow of current to the drain by effecting a modulation of the resistance of the source-to-drain path.

Unipolar transistors may be used as amplifiers or oscillators. More recently they have also found use as high speed switches in logic circuits. For maximum effectiveness in the latter application it is desirable that they operate at high cut off frequencies and that it be possible to connect and operate large number of them within very small space dimensions. One way to achieve high space utilization is to mount units directly on printed circuits. A further, related requirement is that a plurality of the devices may be fabricated on the same semiconductor body with high uniformity and reliability.

Previous attempts to reach the above indicated objectives have resulted in a certain degree of success but several problems have still remained. It has been found, for example, that to operate as a switch at high frequencies, a unipolar transistor should have a very short gate path. That is, the length of the effective part of the gate region should be as short as possible for sharp and rapid change between the conductive and non-conductive states. Some previous attempts to achieve this short gate path, while at the same time retaining capability of mounting directly on printed circuits, have involved grooving or mechanically shaping the surface of the semiconductor body between source and drain, the bottom of the groove, for example, defining the length of the gate path. However, this type of structure has resulted in increasing the series resistance between the source and drain due to increased length of path of the majority carriers, and efforts to decrease this effect by decreasing the distance between the source and drain connections have not been entirely successful.

One object of the present invention is to provide a unipolar transistor having improved operation at high frequencies while maintaining capability of mounting directly on printed circuits.

Another object of the invention is to provide an improved unipolar transistor structure with relatively short gate path and all contacts on one surface.

Another object of the invention is to provide an improved unipolar transistor with relatively low inherent series resistance and all contacts on one surface.

Another object of the invention is to provide a unipolar transistor having improved structure with respect to ease of fabrication both in single units and in multiple unit arrays.

Another object is to provide a unipolar transistor having improved structure with respect to increasing the possibilities of connection to printed circuits.

Still another object is to provide an improved array of unipolar transistors in a single semiconductor body which is relatively easy to fabricate and mount on printed circuits.

A further object is to provide an improved assembly of one or more printed circuits and an array of unipolar transistors.

The foregoing objects have been achieved in accordance with one feature of the invention by providing a unipolar transistor comprising a body of semiconductor material having first and second opposed surfaces, the body including a first region of one conductivity type and a second region of opposite conductivity type with a PN junction therebetween, said second region extending partially through the body from the first surface toward the second surface and occupying only a limited portion of the first surface, a pair of ohmic connections to the first region on the first surface, these connections being disposed on opposite sides of the second region, and two areas of good electrical conductivity on the second surface, these areas having a gap between them which is located opposite the central portion of the second region.

In accordance with another feature of the invention, a plurality of the above described devices are provided on a single semiconductor body. And, in accordance with still another feature of the invention, a strip of such transistors is soldered directly to one or more printed circuits.

The invention will now be more specifically described with reference to the drawing in which like parts are designated with the same numerals.

FIG. 1 is a cross-sectional view of one embodiment of a transistor of the present invention;

FIGS. 2*a*–2*e* are longitudinal cross-sectional views illustrating some of the steps in making an array of transistors in accordance with the present invention;

Figure 1:
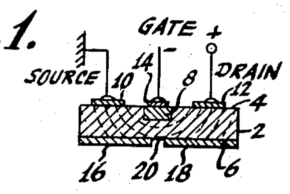

A preferred embodiment of a transistor having a structure in accordance with the present invention is shown in FIG. 1. The device comprises a body of N-type single crystal, semiconducting silicon 2, which may be rectangular in shape and about 1.5 mils thick The body has opposite parallel, planar surfaces 4 and 6.

Extending in from one of the surfaces 4 is a highly doped region 8 of opposite conductivity type penetrating to a depth of about 1 mil. The region 8 is centrally located on the body lengthwise and may itself have a length of about 4 mils. It extends across the entire width of the body. Ohmic source and drain connections 10 and 12 are deposited on either side of the region 8, very closely adjacent thereto and an ohmic connection 14 is also made to the region 8.

Additional metallized regions 16 and 18 are deposited on the opposite face 6 of the body covering this entire face except for a gap 20. These metallized regions 16 and 18 may be spaced apart a distance of about 0.5 to 1.0 mil and are so arranged that the spacing 20 is located opposite the region 8 of opposite conductivity type, either centered or off-center with respect to the region 8.

In operation, with the body 2 being N-type and the region 8 being P-type, as in the present example, the source electrode 10 is biased forwardly to inject majority carriers into the body 2. That is, the drain connection is connected to be at a higher potential positive than the source, the latter being connected to circuit ground. The region 8, which will now be called the gate, is connected so that the junction is biased in the reverse direction. This region is accordingly connected to a source of negative potential.

Majority carriers (electrons) are injected by the source electrode into the body 2 and travel in paths approximately indicated by the dotted lines in FIG. 1. Most of the carriers injected by the source electrode 10 travel across to the metallized area 16 disposed on the opposite face of the body and then, after travelling along this layer, re-enter the body at the gap between metal areas 16 and 18. They travel through the body 2 across the gap and then either travel directly to drain electrode 12, or first through the second metallized area 18, since the path along the metallized area is a path of less resistance, and then across the body 2 to the drain.

Current flow can be cut off by increasing the reverse bias on the gate electrode 8. Increasing the reverse bias widens the space charge layer associated with the PN junction of this electrode and, when the increase is great enough, the resistivity of the portion of the body opposite the gate electrode 8 becomes high enough to shut off current flow. In the improved transistor structure of the present invention, the effective length of the gate path is the length of the gap 20 between metallized areas 16 and 18. The length of this gap can be accurately controlled and made relatively short so that sharp cut-off can be obtained with a given increase in reverse bias voltage on the gate electrode.

Since the transistor structure of the present invention is particularly well adapted to making an array of devices on a single large wafer of semiconductor material, a method of making such an array will now be described.

The semiconductor material used in the process may be a slice of an ingot of N-type single crystal silicon having a resistivity of 25–35 ohm-cm. The slice is ground and polished until it has a thickness of 1.5 mils to form a wafer 22. As shown in the partial cross-section view of FIG. 2*a*, the wafer 22 is provided with an interrupted masking layer 24 of silicon monoxide on one surface thereof and a continuous layer 26 of the same material on the opposite surface. This may be accomplished by placing a masking arrangement of parallel wires 28 on one face of the wafer and evaporating silicon monoxide so that it forms a layer about 0.1–0.2 mil thick on all portions of that face of the wafer not masked. The masking wires may have a diameter of 4 mils and be arranged with a 20 mil distance between their centers.

Figure 2:
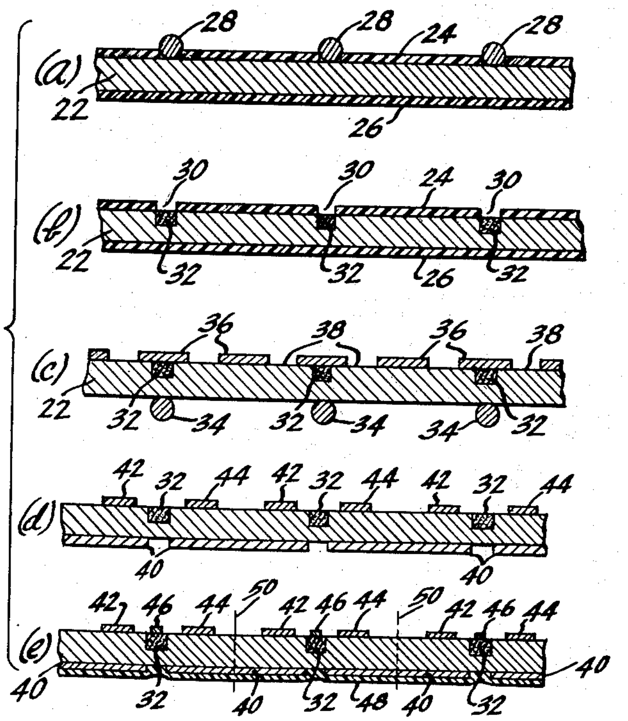

The masking wires are then removed and boron is diffused into the wafer 22 at the spaces 30 left uncovered by the silicon monoxide mask. Any convenient source of boron may be used such as boron oxide vapor and the diffusion is carried out so that the boron diffuses to a depth of about 1 mil and forms a plurality of highly doped P-type regions 32 in the wafer as shown in FIG. 2*b*.

The silicon monoxide masking layers 24 and 26 are then dissolved from both sides of the wafer and another series of parallel masking wires 34 (FIG. 2*c*) is placed against the face of the wafer opposite to that into which boron was diffused. These wires are placed so that they are respectively opposite the previously formed P-type regions 32. The diameters of the wires may be about 0.5 to 4.0 mils and may be of different widths on the same strip. The side of the wafer into which boron was diffused is also masked, as with metal ribbons 36, leaving uncovered spaces 38 on either side of the P-type regions 32.

Nickel containing trace amounts of an N-type impurity, such as phosphorus, is then deposited in vacuo on the unmasked N-type portions of both major surfaces of the wafer, one side at a time. The masking ribbons 36 are removed. This deposition produces, as shown in FIG. 2*d*, a plurality of metallized areas 40 on one side of the wafer and the source electrodes 42 and drain electrodes 44 on the opposite side of the wafer.

Finally, gate electrode connections 46 are deposited on the diffused regions 32 by vacuum-depositing nickel containing traces of a P-type impurity, such as indium. This may be accomplished by masking all surfaces except those on which the metal is to be deposited and evaporating the nickel, and afterwards removing this masking. The side of the wafer containing the metallized areas 40 may be masked with a layer 48 of monoxide, or a low-melting glass, for example, and this masking layer 48 may be left on permanently to provide protection from atmospheric influences. If it is desired to make electrical connection to the metal areas, however, as described in another embodiment, the masking layer 48 may later be wholly or partly removed or only deposited, in the first place, over the gaps between metallized areas 40. Metal ribbons may be used to mask the side having the source and drain connections. The product then appears as shown in FIG. 2*e*, if the masking layer 48 is left intact.

If the objective is to produce a number of individual transistor units, as shown in FIG. 1, the array can be broken up by separating along the dotted lines 50. Since the metallized areas and electrodes can be deposited in strips of almost any desired width, limited only by the width of the slice of semiconductor material, the array can also be first broken into strips in the longitudinal direction before being separated in the transverse direction.

Figures 3, 4:
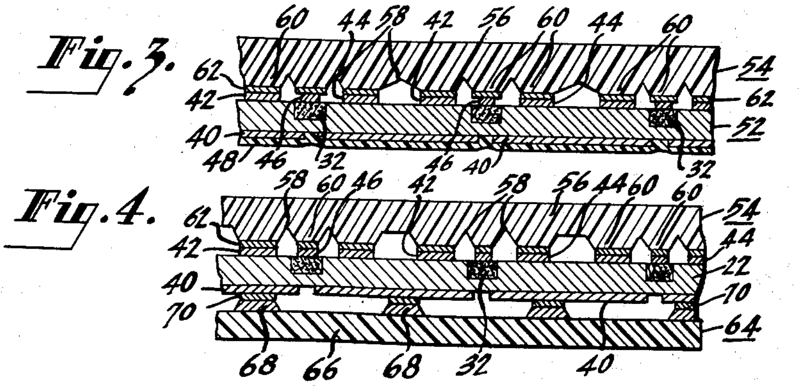
FIG. 3 is a longitudinal cross-sectional view showing how an array of transistors of the present invention may be mounted on a printed circuit board.
FIG. 4 is a view similar to that of FIG. 3 showing how transistors of the present invention may be mounted between two printed circuit boards.

Since it may also be desired, however to make integrated devices having a plurality of transistors on the same semiconductor body, a strip of transistors 52 may be soldered directly to a printed circuit 54 as shown in FIG. 3. By providing a printed circuit comprising an insulating base 56, which may be of ceramic, having grooves 58 which result in the formation of raised areas 60 between the grooves, the tops of these raised areas may be provided with metal coatings 62 and the metallized areas soldered or pressed directly to the proper electrode contacts on the transistor strip with which (1–2 mils) printed wiring strips, grooving is unnecessary. With the present improved transistor structure it is apparent that all necessary transistor contacts are on one surface and this is advantageous in assembling the devices on printed circuits as well as providing improved simplicity of manufacture.

It may be desired, however, to make electrical connections between non-adjacent transistors, for example, which connections are coupled topologically. This would be awkward to do if all contacts were on the same surface but can be accomplished in the transistors of the present invention by leaving off the masking coating 48 and making contact as shown, for example, in FIG. 4. As herein illustrated, a second printed circuit 64 comprising an insulating base 66 with raised areas 68 having metal coatings 70 is soldered or pressed into contact to the metallized areas 40 of the transistor array, providing an added plane to obtain added electrical connections without crossed wires.

Figure 5:
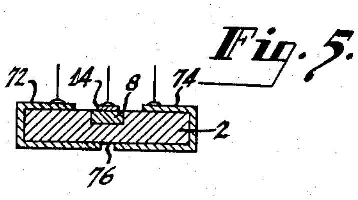
FIG. 5 is a cross-sectional view of another embodiment of a transistor of the present invention.

Another embodiment of transistor in accordance with the present invention is shown in FIG. 5. Although this transistor does not have all of the advantages of the type previously described, it does have certain desirable features. The device comprises a semiconductor body 2 of one conductivity type having a diffused region 8 of opposite conductivity type extending in from a limited area of one face of the body and extending only partially through the body. Source electrode contacts 72 and drain electrode contacts 74 are made by depositing metal coatings beginning at points closely adjacent the edge of the diffused region 8 and extending around the ends of the body to the opposite face and across the opposite face to the gap 76. A gate contact 14 is made to the diffused region 8.

This embodiment of the device has the advantage of low inherent resistance since nearly all charge carriers injected at the source electrode contact travel entirely through a low-resistance metal path until they reach the narrow gap 76. This type of device also has the advantage of having source, gate and drain connections on the same side for easy mounting on printed circuits. Unlike the previous embodiment, however, it cannot be readily fabricated as a plurality of devices on a single series-connected string but on a plate as a strip of one device width which can be broken up into individual units.

What is claimed is:

1. A semiconductor device comprising a body of semiconductive material having first and second opposed surfaces, said body including a first region of one conductivity type and a second region of opposite conductivity type with a PN junction therebetween, said second region extending partially through said body from a limited portion of said first surface, ohmic connections to said first region on said first surface disposed on opposite sides of said second region, and two areas of good electrical conductivity on said second surface, said areas having a gap therebetween located opposite said second region.

2. A semiconductor device comprising a body of semiconductive material having first and second substantially plane parallel surfaces, said body including a first region of one conductivity type and a second region of opposite conductivity type with a PN junction therebetween, said second region extending partially through said body from a limited portion of said first surface, majority charge carrier injecting and collecting electrodes on said first surface disposed on opposite sides of said second region, and two metallized areas on said second surface, said areas having a gap therebetween located opposite said second region.

3. A semiconductor device comprising a body of semiconductive material having first and second substantially parallel surfaces, said body including a first region of N-type conductivity and a second region of P-type conductivity, said second region extending partially through said body from a limited portion of said first surface, metal electrode connections to said first surface disposed on opposite sides of said second region, and two metallized areas on said second surface, said areas having a gap therebetween located opposite said second region.

4. A semiconductor device comprising a body of semiconductive material having first and second opposed surfaces, said body including a first region of one conductivity type and a second region of opposite conductivity type with a PN junction therebetween, said second region extending partially through said body from a limited portion of said first surface, two separate ohmic connections to said first region extending from locations on said first surface on opposite sides of said second region to spaced locations on said second surface opposite said second region.

5. An array of semiconductor devices comprising a wafer of semiconductive material having first and second opposed surfaces, a continuous region of one conductivity type comprising the bulk of said wafer, spaced regions of opposite conductivity type extending partially through said wafer from said first surface, separate ohmic connections on said first surface spaced from opposite edges of said regions of opposite conductivity type, and separate metallized areas on said second surface having gaps therebetween located opposite said regions of opposite conductivity type.

6. An integrated device and circuit assembly comprising an array of semiconductor devices on a single body of semiconductor material having first and second opposed parallel surfaces each of said devices comprising a region of one conductivity type, a region of opposite conductivity type extending partially through said body from said first surface, ohmic connections on said first surface to said region of one conductivity type spaced from opposite edges of said region of opposite conductivity type, an additional ohmic connection to said opposite type region and metallized areas on said second surface having a gap therebetween located opposite said region of opposite conductivity type, and a printed circuit having portions thereof directly soldered to said ohmic connections.

7. An integrated device and circuit assembly comprising an array of semiconductor devices on a single body of semiconductor material having first and second parallel surfaces, each of said devices comprising a region of one conductivity type, a region of opposite conductivity type extending partially through said body from said first surface, ohmic connections on said first surface to said region of one conductivity type spaced from opposite edges of said region of opposite conductivity type, an additional ohmic connection to said opposite type region, and metallized areas on said second surface having a gap therebetween located opposite said region of opposite conductivity type; a first printed circuit having portions thereof directly soldered to said ohmic connections, and a second printed circuit having portions soldered directly to said metallized areas.

References Cited in the file of this patent

UNITED STATES PATENTS

| | | |
|---|---|---|
| 2,802,159 | Stump | Aug. 6, 1957 |
| 2,829,422 | Fuller | Apr. 8, 1958 |
| 2,842,668 | Rutz | July 8, 1958 |
| 2,877,359 | Ross | Mar. 10, 1959 |
| 2,915,646 | Kurshan | Dec. 1, 1959 |